United States Patent
Veenstra et al.

(10) Patent No.: US 7,593,499 B1
(45) Date of Patent: Sep. 22, 2009

(54) APPARATUS AND METHOD FOR LOW POWER ROUTING OF SIGNALS IN A LOW VOLTAGE DIFFERENTIAL SIGNALING SYSTEM

(75) Inventors: Kerry Veenstra, San Jose, CA (US); Krishna Rangasayee, Pleasanton, CA (US); Robert Bielby, Pleasanton, CA (US)

(73) Assignee: Altera Corporation, San Jose, CA (US)

( * ) Notice: Subject to any disclaimer, the term of this patent is extended or adjusted under 35 U.S.C. 154(b) by 574 days.

(21) Appl. No.: 11/198,097

(22) Filed: Aug. 4, 2005

Related U.S. Application Data

(62) Division of application No. 09/531,862, filed on Mar. 21, 2000, now Pat. No. 6,956,920.

(60) Provisional application No. 60/125,498, filed on Mar. 22, 1999.

(51) Int. Cl.
   *H04L 24/40*   (2006.01)
   *H04L 23/00*   (2006.01)
   *H03D 3/24*    (2006.01)

(52) U.S. Cl. .................. 375/372; 375/373; 375/377

(58) Field of Classification Search ................ 375/354, 375/372, 374, 373, 376, 377; 327/241, 144, 327/152, 158, 159, 161; 326/38; 340/870.35, 340/870.36, 853.9; 330/252; 370/284; 324/211; 345/198, 686; 360/78.07; 369/47.33, 47.34; 379/88.28
See application file for complete search history.

(56) References Cited

U.S. PATENT DOCUMENTS

| | | | | | |
|---|---|---|---|---|---|
| 4,668,985 | A | * | 5/1987 | Kurashige et al. | 348/721 |
| 5,027,323 | A | * | 6/1991 | Miyamoto et al. | 365/189.11 |
| 5,058,132 | A | * | 10/1991 | Li | 375/260 |
| 5,363,409 | A | * | 11/1994 | Desilets | 375/272 |
| 5,394,443 | A | * | 2/1995 | Byers et al. | 375/371 |
| 5,402,389 | A | * | 3/1995 | Flannagan et al. | 365/230.06 |
| 5,635,934 | A | * | 6/1997 | Brown | 341/118 |
| 5,808,479 | A | * | 9/1998 | Sasaki et al. | 326/41 |
| 5,821,809 | A | * | 10/1998 | Boerstler et al. | 327/563 |
| 5,909,193 | A | * | 6/1999 | Phillips et al. | 342/410 |
| 6,084,452 | A | * | 7/2000 | Drost et al. | 327/175 |
| 6,100,735 | A | * | 8/2000 | Lu | 327/158 |
| 6,107,826 | A | * | 8/2000 | Young et al. | 326/41 |
| 6,169,434 | B1 | * | 1/2001 | Portmann | 327/175 |
| 6,338,144 | B2 | * | 1/2002 | Doblar et al. | 713/400 |
| 6,956,920 | B1 | * | 10/2005 | Veenstra et al. | 375/372 |

* cited by examiner

*Primary Examiner*—Tesfaldet Bocure
*Assistant Examiner*—Lawrence B Williams
(74) *Attorney, Agent, or Firm*—Ward & Olivo

(57) ABSTRACT

A signal routing apparatus comprises a register bank to store a set of data signals. A delay locked loop generates a set of phase displaced clock signals. A phase controlled read circuit sequentially routes the set of data signals from the register bank in response to the phase displaced clock signals. A Low Voltage Differential Signaling buffer connected to the phase controlled read circuit transmits the data signals in a Low Voltage Differential Signaling mode. The phase displaced clock signals operate in lieu of a higher clock rate in order to reduce power consumption.

20 Claims, 9 Drawing Sheets

APPARATUS AND METHOD FOR LOW POWER ROUTING OF SIGNALS IN A LOW VOLTAGE DIFFERENTIAL SIGNALING SYSTEM

This application is a Divisional of application Ser. No. 09/531,862, filed Mar. 21, 2000, now U.S. Pat. No. 6,956,920, the entire disclosure of which is incorporated by reference herein. The '862 application claims priority to the provisional patent application entitled "Apparatus and Method for Routing Signals in a Low Voltage Differential Signaling System," Ser. No. 60/125,498, filed Mar. 22, 1999.

BRIEF DESCRIPTION OF THE INVENTION

This invention relates generally to transporting data in digital systems. More particularly, this invention relates to a low power technique for multiplexing and de-multiplexing signals in a Low Voltage Differential Signaling (LVDS) system.

BACKGROUND OF THE INVENTION

Low Voltage Differential Signaling (LVDS) is a low swing, differential signaling technology that facilitates high speed data transmission. Its low swing and current mode driver outputs create low noise and consume relatively little power.

FIG. 1 illustrates a prior art LVDS driver 22 and receiver 24 connected via differential lines 25. A 100 Ohm differential impedance 26 is placed between the lines 25. The driver 22 includes a current source 27 that drives one of the differential lines 25. The receiver 24 has a high DC impedance (it does not source or sink DC current), so the majority of driver current flows across the 100 Ohm termination resistor 26 generating, in this embodiment, approximately 350 mV across the inputs of the receiver 24. When the opposite transistors of the driver 22 (the "−" transistors instead of the "+" transistors) are activated, current flows in the opposite direction. In this way, valid digital high and low states are transported.

The differential data transmission method used in LVDS is less susceptible to common-mode noise than single-ended schemes. Differential transmission conveys information using two wires with opposite current/voltage swings, instead of one wire used in single-ended methods. The advantage of the differential approach is that noise is coupled onto the two wires in a common mode (the noise appears on both lines equally) and is thus rejected by the receiver 24, which looks only at the difference between the two signals. The differential signals also tend to radiate less noise than single-ended signals, due to the canceling of magnetic fields. In addition, the current mode drive is not prone to ringing and switching spikes, thereby further reducing noise.

Since LVDS reduces concerns about noise, it can use lower signal voltage swings. This advantage is crucial, because it is impossible to raise data rates and lower power consumption without using low voltage swings. The low swing nature of the driver means data can be switched very quickly. Since the driver is also current mode, very low power consumption across frequency is achieved since the power consumed by the load is substantially constant.

FIG. 2 illustrates an LVDS communication system 30 including a transmitter 32 and a receiver 34 linked by a channel 35. The transmitter 32 multiplexes a large number of channels (e.g., 21 or 28) onto the smaller width channel 35 (e.g., having 4 or 5 channels). A serializer or multiplexer 36 is used to perform this function. The opposite function is performed at the receiver 34. That is, a de-serializer or de-multiplexer 38 takes the signals from the smaller width channel 35 and applies them across a large number of channels (e.g., 21 or 28). The relatively small channel 35 is used to reduce board, connector, and/or cable costs. This technique also lowers power, noise, and electromagnetic interference.

FIG. 3 illustrates a prior art multiplexer 36 with four parallel-load shift registers (register banks) 40A-40D. Register banks 40A-40D respectively receive signals from buses 41A-41D. Register banks 40A-40D respectively drive differential output signals to differential output drivers 42A-42D.

A control logic circuit 43 and a clock/phase locked loop circuit 44 are connected to a control signal bus 45. The clock/phase locked loop circuit 44 receives a standard rate clock signal and produces a clock signal at seven times the standard rate. This faster clock signal is applied to the control signal bus 45 to drive each register bank 40. The standard clock signal is applied to the output clock differential driver 42E.

In the disclosed embodiment, each bus 41 carries seven signals which are transmitted at seven times the standard clock rate over each LVDS channel 42A-42D. Since the multiplexing and de-multiplexing operations are complementary, only multiplexing operations are discussed, however it should be understood that the invention covers both multiplexing and de-multiplexing operations.

There are a number of problems associated with the multiplexer 36 of FIG. 3. Since the multiplexer 36 operates at seven times the speed of the system clock, it consumes a relatively large amount of power. In addition, it is relatively difficult to generate and distribute the higher speed clock.

In view of the foregoing, it would be highly desirable to provide an improved signal control technique for use in LVDS systems. Ideally, such a system would have a relatively simple clock architecture and would operate in a lower power mode.

SUMMARY OF THE INVENTION

The invention includes a signal routing apparatus with a register bank to store a set of data signals. A delay locked loop generates a set of phase displaced clock signals. A phase controlled read circuit sequentially routes the set of data signals from the register bank in response to the phase displaced clock signals. A Low Voltage Differential Signaling buffer connected to the phase controlled read circuit transmits the data signals in a Low Voltage Differential Signaling mode.

The invention includes a method of routing signals. Data signals are stored. Phase displaced clock signals are generated. The data signals are sequentially routed in response to the phase displaced clock signals to form sequentially routed signals. Low Voltage Differential Signaling mode signals corresponding to the sequentially routed signals are then transmitted.

The invention establishes an improved signal control technique for use in Low Voltage Differential Signaling systems. Advantageously, the delay locked loop provides a relatively simple clock architecture that facilitates low power mode operation, as the phase displaced signals are used in lieu of a higher frequency clock signal.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

Figure 4:
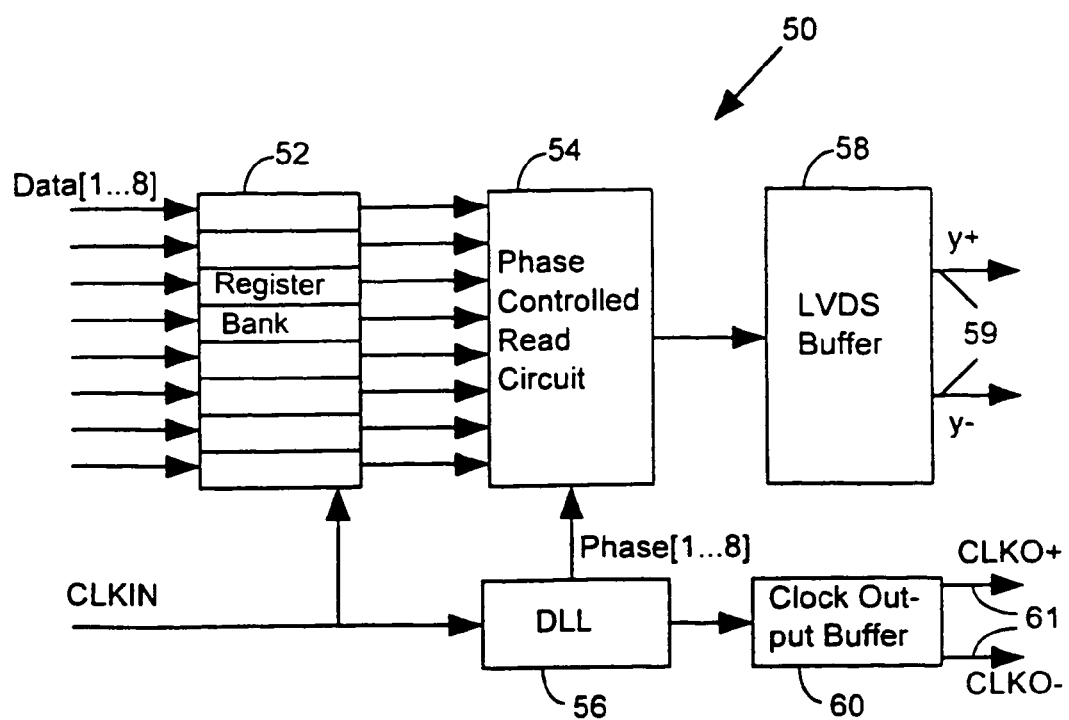
FIG. 4 illustrates the signal router of the invention positioned in a transmitting device in accordance with an embodiment of the invention.

FIG. 4 illustrates a signal router 50 constructed in accordance with an embodiment of the invention. The signal router 50 includes a register bank 52. In this embodiment, the register bank 52 loads eight data signals in parallel. A phase controlled read circuit 54 sequentially routes the signals to a LVDS buffer 58, which subsequently applies the signals to a differential signaling channel 59.

The phase controlled read circuit 54 is controlled by a delay locked loop 56. The delay locked loop 56 receives an input clock signal and generates a set of eight phase displaced signals that are applied to the phase controlled read circuit 54. The delay locked loop 56 routes the input signal to a clock output buffer 60, which produces a differential output signal on differential signal lines 61.

Figure 5:
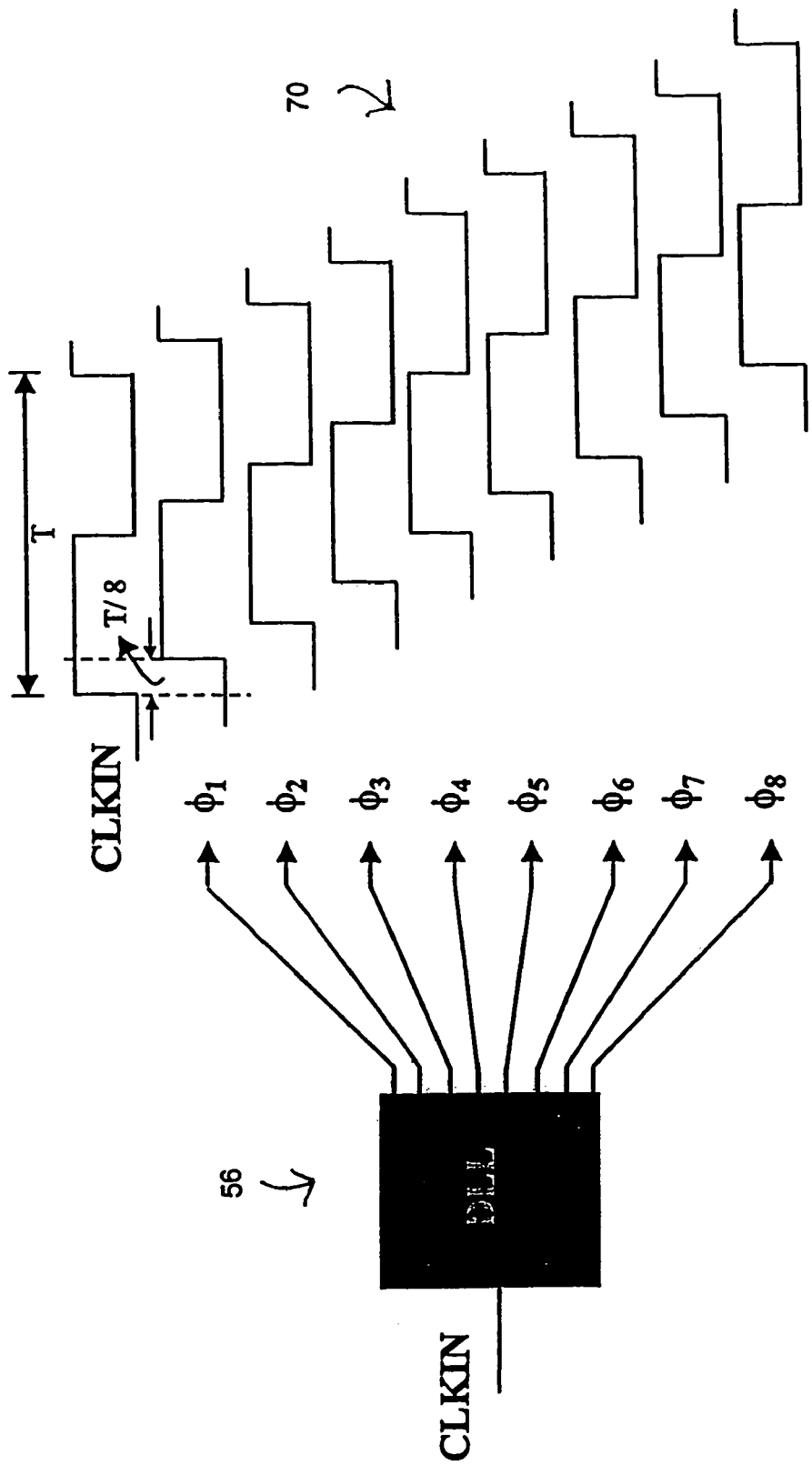
FIG. 5 illustrates a delay locked loop utilized in connection with the system of FIG. 4.

FIG. 5 illustrates the delay locked loop 56 generating a set of phase displaced signals 70. Each phase displaced signal is displaced from an adjacent phase displaced signal by ⅛ of a cycle.

The eight output clocks from the delay locked loop 56 are used to route the eight signals from the register bank 52. In other words, one clock signal from the delay locked loop 56 is assigned to each register of the register bank 52. Thus, a signal in a register bank is driven from the register bank 52 to the buffer 58 in response to its delay locked loop signal, resulting in the register bank driving a signal to the buffer 58 every ⅛ of a clock cycle.

Figure 6:
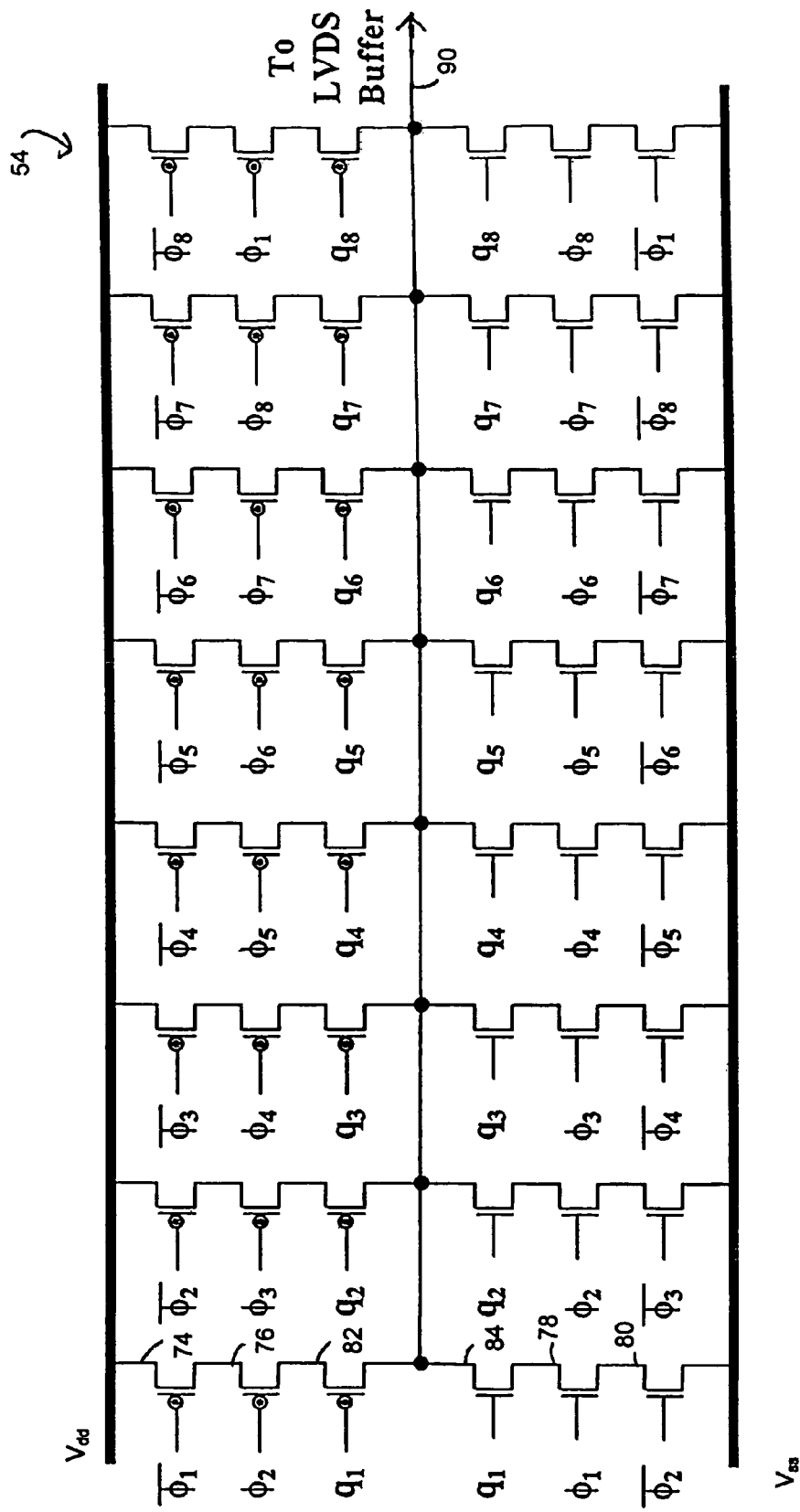
FIG. 6 illustrates a controller utilized in connection with the system of FIG. 4.

FIG. 6 illustrates a phase controlled read circuit 54 that may be used to accomplish this functionality. In FIG. 6, $q_1$ through $q_8$ are the outputs from the register bank 52, while $\phi_1$ through $\phi_8$ are the outputs of the delay locked loop 56.

The operation of the read circuit 54 is appreciated with reference to a single column of transistors. For example, consider the first column of transistors on the left side of the circuit 54. Initially, the $\phi_1$ signal is high and the $\phi_2$ signal is low. The digital high $\phi_1$ signal is inverted and therefore turns-on PMOS transistor 74, the digital low $\phi_2$ signal turns-on PMOS transistor 76, the digital high $\phi_1$ signal causes the NMOS transistor 78 to turn-on, while the inverted $\phi_2$ signal has a digital high value and thereby causes the NMOS transistor 80 to turn-on.

In sum, transistors 74, 76, 78 and 80 are turned-on. The output of node 90 will now be determined by the states of transistors 82 and 84, which receive the input signal $q_1$. If $q_1$ is a digital low value, then transistor 82 turns-on and transistor 84 remains off. Transistors 74, 76 and 82 drive a digital high signal onto the output node 90. Thus, transistors 74, 76 and 82 operate as a set of pull-up transistors.

Alternately, if $q_1$ has a digital high value, then transistor 82 is off and transistor 84 turns-on. Transistors 84, 78, and 80 pull the output node 90 to a digital low value. Thus, transistors 84, 78, and 80 operate as a set of pull-down transistors.

Observe that this operation occurs in the ⅛ of a cycle while the $\phi_1$ signal is high and the $\phi_2$ signal is low. When $\phi_1$ and $\phi_2$ are both high, transistors 76 and 80 will be turned-off, thereby preventing the column of transistors from driving a signal on the output node 90. However, at this point, the next column of transistors is operative. This cascaded operation is repeated for each signal phase. The output node 90, which is connected to each column of transistors, operates as a hardwired logical OR circuit.

Figure 1:
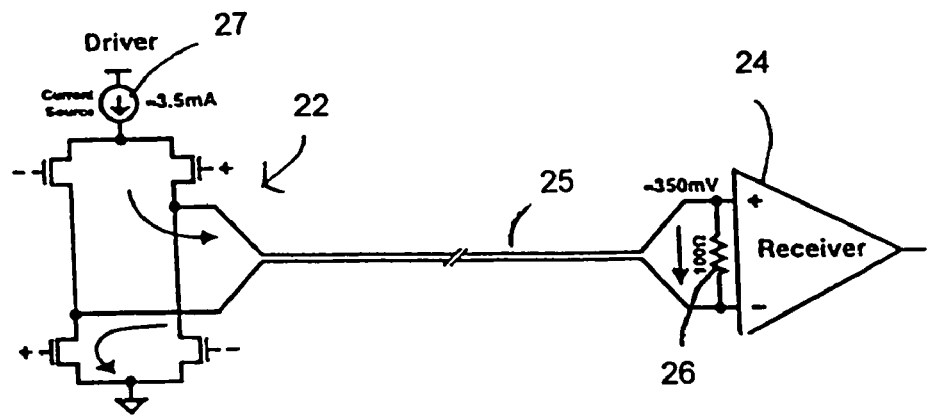
FIG. 1 illustrates an LVDS driver and receiver in accordance with the prior art.
Figure 2:
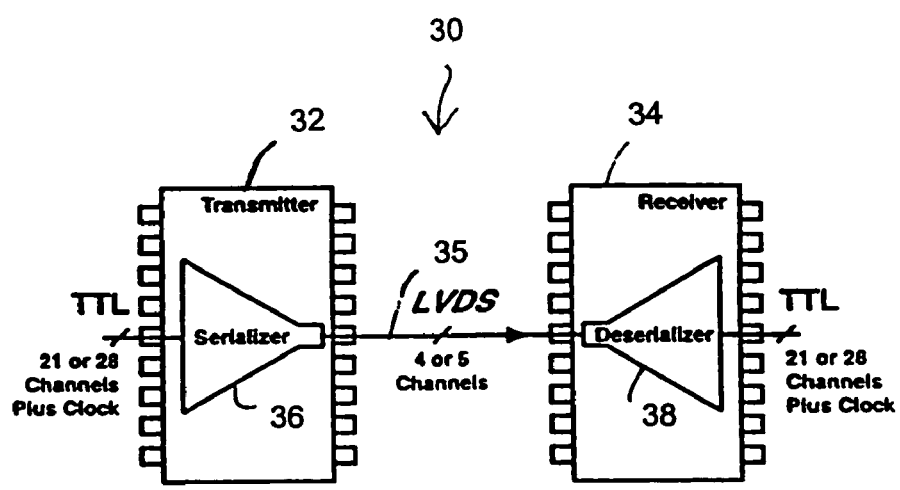
FIG. 2 illustrates an LVDS transport system in accordance with the prior art.
Figure 3:
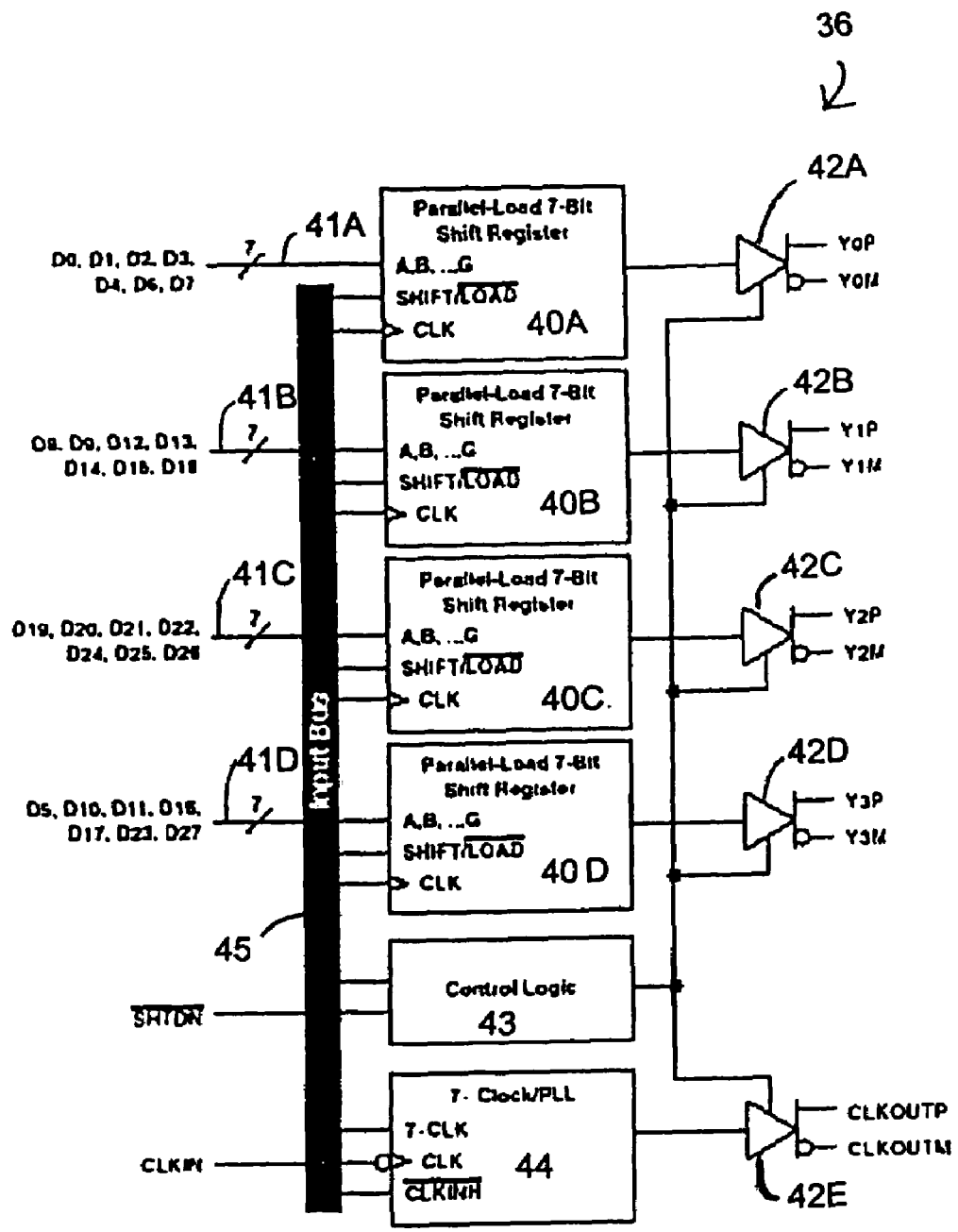
FIG. 3 illustrates a multiplexer for use in a prior art LVDS system.

Observe that each register in the register bank 52 operates at the standard clock rate, not a multiple of the clock rate. Thus, the simplified clock scheme does not have to generate high clock speeds. This results in low power consumption. In addition, concerns regarding whether a process technology can support high frequency clock signals no longer apply. Only the LVDS buffer 58 is required to operate at the higher clock speed (e.g., 8 times the clock speed). The LVDS buffer may be implemented using a standard LVDS configuration, such as drivers 42 in FIG. 3.

A multiplexer or de-multiplexer configuration is established by selecting the size of the register bank 52 and the corresponding delay locked loop 56. This flexible scheme is highly extendible to conform to the number of LVDS channels.

Figure 7:
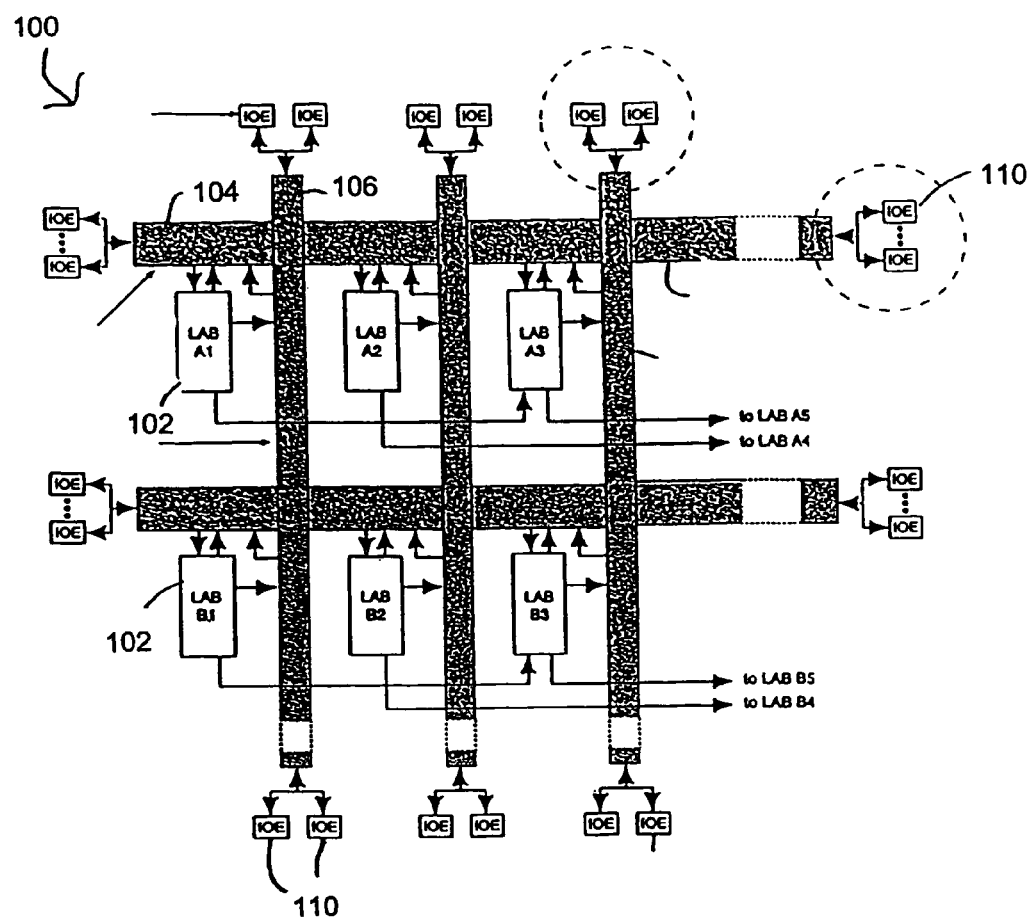
FIG. 7 illustrates a programmable logic device architecture incorporating the signal router of the invention.

The router 50 may be used in any number of architectures. For example, the router 50 may be a discrete circuit embedded in a programmable logic device. Alternately, the router 50 may be implemented into the logical blocks of a programmable logic device. FIG. 7 illustrates a programmable logic device 100. PLDs (sometimes referred to as PALs, PLAs, FPLAs, PLDs, EPLDs, EEPLDs, LCAs, or FPGAs) are well-known integrated circuits that provide the advantages of fixed integrated circuits with the flexibility of custom integrated circuits. Such devices allow a user to electrically program standard, off-the-shelf logic elements to meet a user's specific needs. See, for example, U.S. Pat. No. 4,617,479, incorporated herein by reference for all purposes. Such devices are currently represented by, for example, Altera's MAX® series of PLDs and FLEX® series of PLDs. The former are described in, for example, U.S. Pat. Nos. 5,241,224 and 4,871,930, and the Altera Data Book, June 1999, all incorporated herein by reference. The latter are described in, for example, U.S. Pat. Nos. 5,258,668; 5,260,610; 5,260,611; and 5,436,575, and the Altera Data Book, June 1999, all incorporated herein by reference.

The programmable logic device 100 includes a set of logic array blocks 102. Row interconnect circuitry 104 and column interconnect circuitry 106 link the various logic array blocks 102. Input/output elements 110 positioned at the ends of the row interconnect circuitry 104 and column interconnect circuitry 106 are used for input/output connections with external devices.

Figure 8:
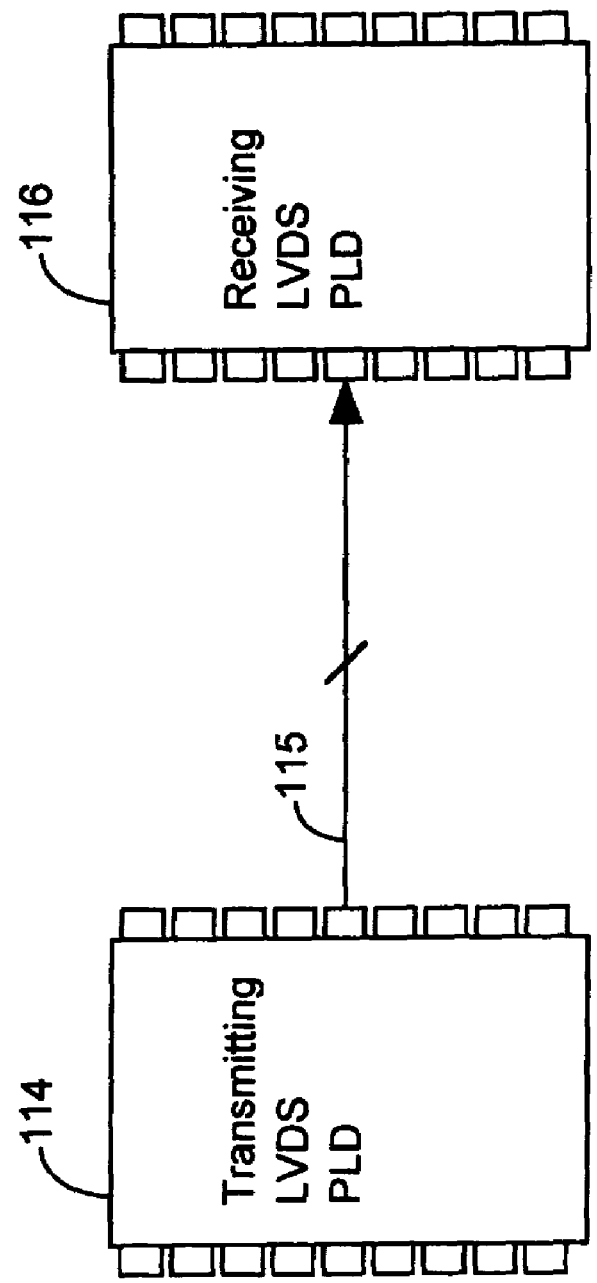
FIG. 8 illustrates transmitting and receiving LVDS programmable logic devices configured in accordance with the invention.

FIG. 8 illustrates a programmable logic device 114 configured for LVDS transmission. The figure also illustrates a programmable logic device 116 configured for LVDS reception. A differential signal channel 115 connects the two devices. Each device may also receive Transistor-Transistor Logic (TTL) signals at signal pins that are not connected to the differential signal channel 115.

Figure 9:
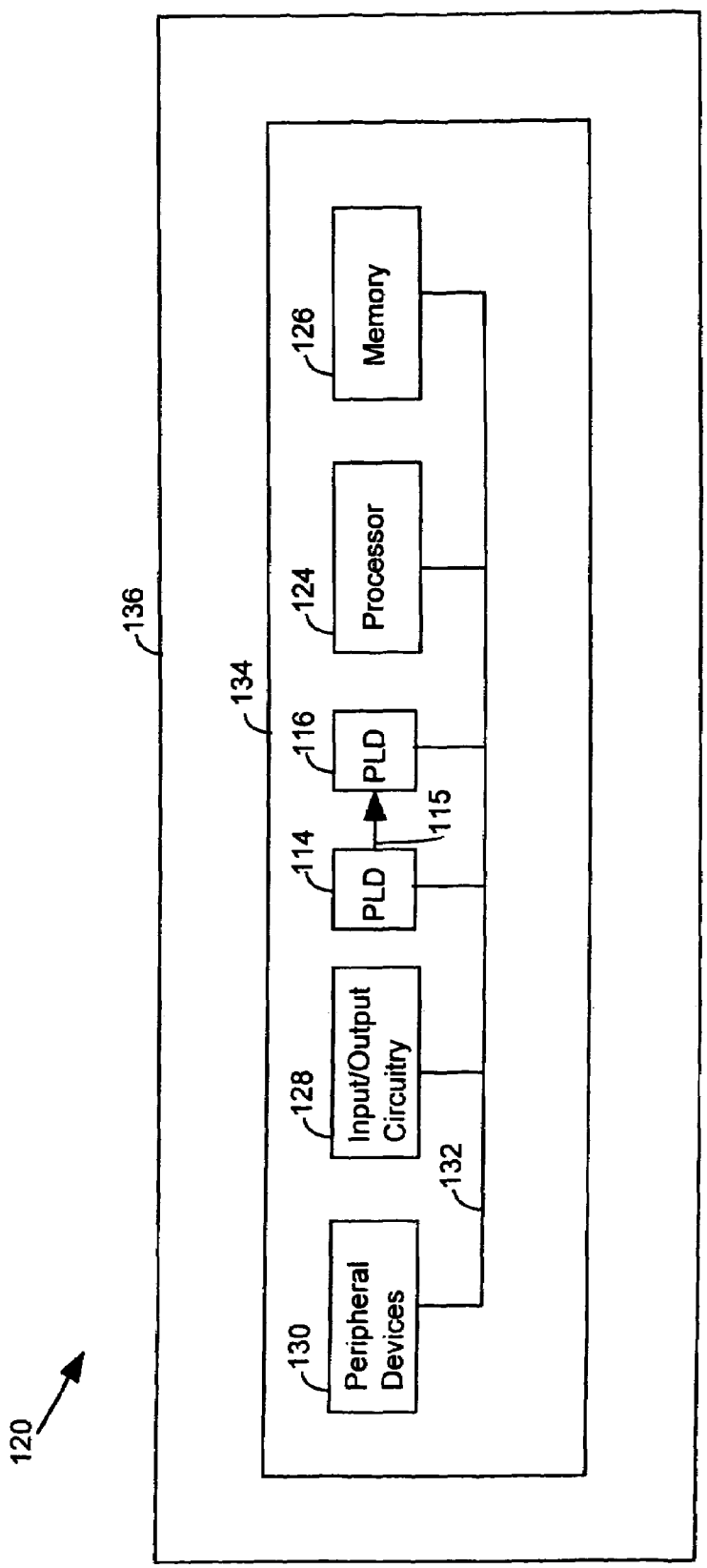
FIG. 9 illustrates a digital system incorporating LVDS programmable logic devices of the invention.

The PLDs 114 and 116 of FIG. 8 may be incorporated into a larger digital system, as shown in FIG. 9. FIG. 9 illustrates a data processing system 120. The data processing system 120 may include one or more of the following components: a processor 124, a memory 126, input/output circuitry 128, and peripheral devices 130. These components are coupled together by a system bus 132 and are populated on a circuit board 134, which is contained in an end-user system 136.

The system 120 can be used in a wide variety of applications, such as computer networking, data networking, instrumentation, video processing, digital signal processing, or any other application where the advantage of using re-programmable logic is desirable. The PLDs 114 and 116 can be used to perform a variety of logic functions. For example, they can be configured as a processor or controller that works in cooperation with processor 124. The PLDs 114 and 116 may also be used as an arbiter for arbitrating access to a shared resource in the system 120. In yet another example, the PLDs 114 and 116 can be configured as an interface between the processor 124 and one of the other components in the system 120. The PLDs 114 and 116 may communicate with the other elements of the system 120 using either TTL signaling or differential signaling.

The invention was described in the context of a transmitting device in which the contents of a register bank 52 are sequentially read in response to the phase delayed signals. Those skilled in the art will appreciate that the technique of the invention can also be used at a receiving device. In particular, the phase delayed signals can be used to sequentially latch a set of received signals into a register bank. After all of the signals are received, the received signals can be loaded in parallel to an adjacent register bank and then be processed in a standard manner.

Figure 10:
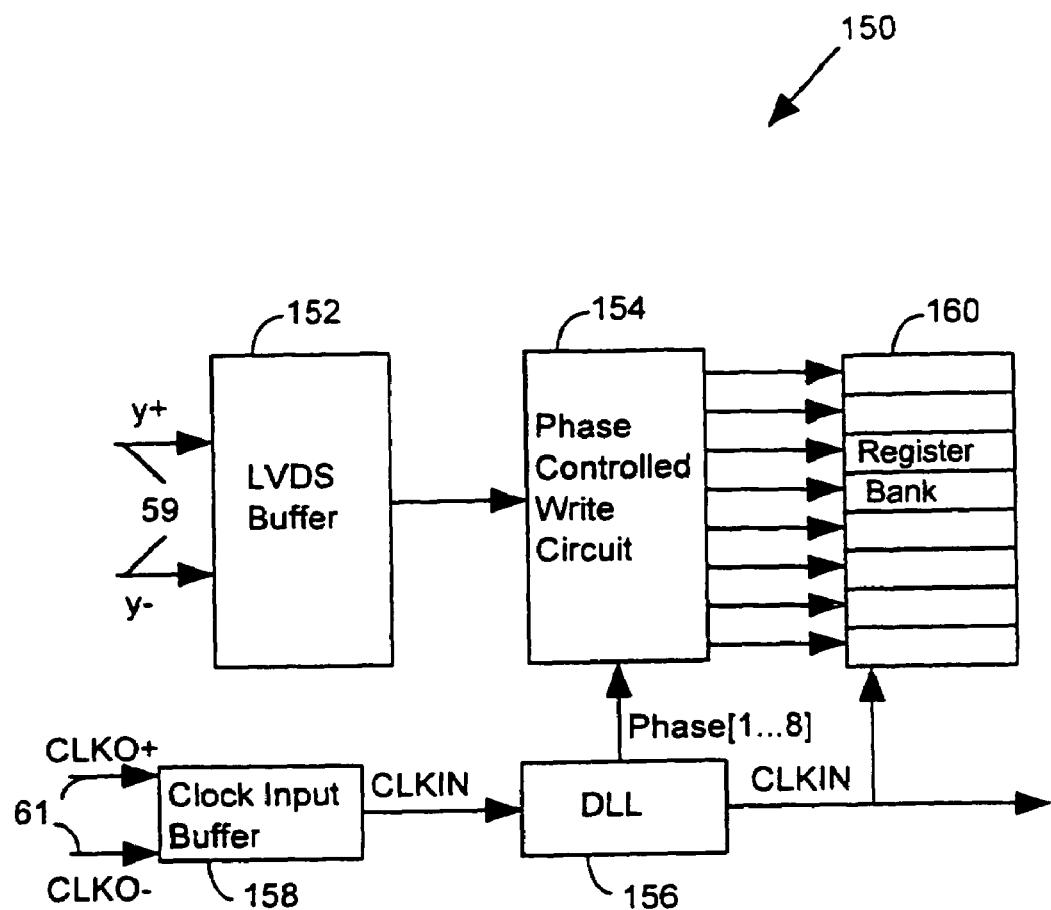
FIG. 10 illustrates the signal router of the invention positioned in a receiving device in accordance with an embodiment of the invention.

FIG. 10 illustrates such a system. The receiving device 150 includes an LVDS buffer 152 to convert each received differential signal into a single ended signal, which is applied to the phase controlled write circuit 154. The phase controlled write circuit 154 is a set of registers that sequentially loads received signals in response to the phase delayed signals from the DLL 156. Once the phase controlled write circuit is loaded, its contents can be written in parallel to the register bank 160.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

The invention claimed is:

1. A signal routing apparatus, comprising:
    a Low Voltage Differential Signaling buffer to receive a plurality of Low Voltage Differential Signaling mode signals and produce a corresponding plurality of single ended signals;
    a delay locked loop to generate a plurality of phase displaced clock signals;
    a phase controlled write circuit connected to said Low Voltage Differential Signaling buffer and said delay locked loop to store each of said set of single ended signals in response to a different one of said phase displaced clock signals.

2. The signal routing apparatus of claim 1 further comprising a register bank connected to said phase controlled write circuit, said register bank storing in parallel said set of singled ended signals.

3. The signal routing apparatus of claim 1 in combination with a programmable logic device.

4. The signal routing apparatus of claim 3 wherein said programmable logic device is connected to a system bus.

5. The signal routing apparatus of claim 4 wherein a memory is connected to said system bus.

6. The signal routing apparatus of claim 4 wherein a processor is connected to said system bus.

7. The signal routing apparatus of claim 4 wherein input/output circuitry is connected to said system bus.

8. The signal routing apparatus of claim 4 wherein a peripheral device is connected to said system bus.

9. A signal routing apparatus, comprising:
    a Low Voltage Differential Signaling buffer to receive a set of Low Voltage Differential Signaling mode signals and produce a corresponding set of single ended signals;
    a delay locked loop to generate a set of phase displaced clock signals;
    a phase controlled write circuit connected to said Low Voltage Differential Signaling buffer and said delay locked loop to store said set of single ended signals in response to said phase displaced clock signals;
    wherein said phase controlled write circuit includes a set of transistor columns, each transistor column of said set of transistor columns being responsive to two phase displaced clock signals of said set of phase displaced clock signals.

10. The signal routing apparatus of claim 9 wherein each transistor column of said set of transistor columns includes a subset of pull-up transistors connected to an output node, said subset of pull-up transistors processing a first phase displaced clock signal and a second phase displaced clock signal immediately adjacent to said first phase displaced clock signal.

11. The signal routing apparatus of claim 10 wherein each transistor column of said set of transistor columns includes a subset of pull-down transistors connected to said output node, said subset of pull-down transistors processing a first phase displaced clock signal and a second phase displaced clock signal immediately adjacent to said first phase displaced clock signal.

12. A method of routing signals comprising:
    converting a plurality of received differential signals into single ended signals;
    generating a plurality of phase displaced clock signals;
    sequentially loading each of said single ended signals into a phase controlled write circuit in response to a different one of the phase displaced clock signals; and
    writing the single ended signals in parallel from the phase controlled write circuit to a storage device.

13. The method of claim 12 wherein the storage device is a register bank.

14. The method of claim 12 wherein the generating step includes the step of generating said set of phase displaced clock signals with a delay locked loop.

15. A low voltage differential signaling system comprising:
 a low voltage differential signaling transmitter comprising:
 a register bank to store a set of data signals;
 a delay locked loop to generate a set of phase displaced clock signals;
 a phase controlled read circuit to sequentially route said set of data signals from said register bank in response to said phase displaced clock signals; and
 a low voltage differential signaling buffer connected to said phase controlled read circuit to transmit said data signals in a low voltage differential signaling mode; and
 a low voltage differential signaling receiver comprising:
 a low voltage differential signaling buffer to receive a set of low voltage differential mode signals transmitted by the low voltage differential signaling transmitter and produce a corresponding set of single ended signals;
 a delay locked loop to generate a set of phase displaced clock signals; and
 a phase controlled write circuit connected to said low voltage differential signaling buffer and said delay locked loop to store said set of single ended signals in response to said phase displaced clock signals.

16. The signal routing apparatus of claim 15 further comprising a register bank connected to said phase controlled write circuit, said register bank storing in parallel said set of singled ended signals.

17. The signal routing apparatus of claim 15 wherein said phase controlled read circuit includes a set of transistor columns, each transistor column of said set of transistor columns being responsive to two phase displaced clock signals of said set of phase displaced clock signals.

18. The signal routing apparatus of claim 17 wherein each transistor column of said set of transistor columns includes a subset of pull-up transistors connected to an output node, said subset of pull-up transistors processing a first phase displaced clock signal, a second phase displaced clock signal immediately adjacent to said first phase displaced clock signal, and a register bank signal.

19. The signal routing apparatus of claim 18 wherein each transistor column of said set of transistor columns includes a subset of pull-down transistors connected to said output node, said subset of pull-down transistors processing a first phase displaced clock signal, a second phase displaced clock signal immediately adjacent to said first phase displaced clock signal, and a register bank signal.

20. The signal routing apparatus of claim 15 in combination with a programmable logic device.

* * * * *

UNITED STATES PATENT AND TRADEMARK OFFICE
CERTIFICATE OF CORRECTION

PATENT NO.        : 7,593,499 B1
APPLICATION NO.   : 11/198097
DATED             : September 22, 2009
INVENTOR(S)       : Veenstra et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 988 days.

Signed and Sealed this

Twenty-first Day of September, 2010

David J. Kappos
*Director of the United States Patent and Trademark Office*